United States Patent [19]
Schwartz et al.

[11] Patent Number: 5,205,751
[45] Date of Patent: Apr. 27, 1993

[54] ELECTRICALLY-CONDUCTIVE ELASTOMERIC CONNECTOR

[75] Inventors: Mark W. Schwartz, Addison; Scott R. Semenik, Lake Zurich, both of Ill.

[73] Assignee: Motorola, Inc., Schaumburg, Ill.

[21] Appl. No.: 839,160

[22] Filed: Feb. 21, 1992

[51] Int. Cl.[5] .................................. H05K 9/00
[52] U.S. Cl. .................................. 439/86; 174/35 GC
[58] Field of Search .................... 174/35 GC, 35 R; 361/424; 439/92, 86

[56] References Cited

U.S. PATENT DOCUMENTS

| | | | |
|---|---|---|---|
| 2,766,494 | 10/1956 | Stremmel | 49/490 |
| 4,823,235 | 4/1989 | Suzuki et al. | 174/35 R |
| 5,068,493 | 11/1991 | Benn, Sr. et al. | 174/35 GC |
| 5,124,889 | 6/1992 | Humbert et al. | 174/35 R |

FOREIGN PATENT DOCUMENTS

| | | | |
|---|---|---|---|
| 2352942 | 12/1977 | France | 49/491 |
| 35812 | 11/1969 | German Democratic Rep. | 49/490 |

OTHER PUBLICATIONS

IBM Technical Bulletin, Lockart, vol. 20, No. 10, p. 4026, Mar. 1978.
IBM Technical Bulletin, Crosby, vol. 20, No. 1, p. 282, Jun. 1977.

Primary Examiner—Neil Abrams
Attorney, Agent, or Firm—Robert H. Kelly

[57] ABSTRACT

An electrically-conductive, elastomeric connector for electrically connecting a circuit path of an electrical circuit disposed upon a substrate having an electrically-conductive edge portion which forms a portion of the electrical circuit with an electrically-conductive cover which covers at least a portion of the substrate. The elastomeric connector comprises a tubular-shaped body elongated along a longitudinal axis thereof, and a central aperture extending through the tubular-shaped body. Compressive forces exerted against the tubular-shaped body when positioned against the electrically-conductive cover causes seating of the tubular-shaped body against the electrically-conductive cover. First and second claw arms extend beyond a side surface positioned in opposition to the seating surface of the tubular-shaped body. The claw arms permit affixation of the tubular-shaped body to an edge portion of the substrate. When the claw arms position the tubular body in affixed engagement with the substrate, the side surface positioned in opposition to the seating surface abuts against the electrically-conductive edge portion of the substrate to be electrically connected therewith. Thereby, the circuit path of the electrical circuit is electrically connected with the electrically-conductive housing by way of the elastomeric connector.

17 Claims, 4 Drawing Sheets

ELECTRICALLY-CONDUCTIVE ELASTOMERIC CONNECTOR

BACKGROUND OF THE INVENTION

The present invention relates generally to electrical connectors for connecting two surfaces, and, more particularly, to a flexible, electrically-conductive, elastomeric connector suitable for electrically connecting two substrates theretogether.

A large number of electronic devices contain circuitry which generate high-frequency signals. For instance, the circuitry of the vast majority of radio communication apparatus generate high frequency signals during operation thereof. (Such high frequency signals are typically generated by one or more high-frequency oscillators which form portions of the electronic circuitry of such apparatus.) A radio transceiver, such as a radiotelephone utilized in a cellular, communication system, is one example of radio communication apparatus.

As a byproduct of operation of the circuitry of such radio communication apparatus (as well as many of the large number of other electronic devices which contain circuitry which generates high-frequency signals), spurious, high-frequency, electromagnetic signals are also generated. Such spurious signals, while a byproduct of normal operation of the radio communication apparatus, are undesirable as such spurious signals can interfere with signals transmitted by other radio communication apparatus.

In order to minimize the effects of such interference, electromagnetic shielding material is oftentimes positioned to cover the electronic circuitry of such apparatus whereat the spurious electromagnetic signals may be generated. While housing structures of most radio communication apparatus are typically comprised of a thermoplastic material, by coating inner surfaces of such housing structures with an electrically-conductive, electromagnetic shielding material, the housing structures may be conveniently adapted to form electromagnetic shields which prevent emanation of the spurious electromagnetic signals generated by electronic circuitry housed within such housing structures.

The electrically-conductive material coated on the inner surfaces of such housings, however, must be electrically connected to the electrical circuits which generate the spurious, electromagnetic signals to block the emanation of the spurious, electromagnetic signals. Typically, an electrical connection is made with a ground plane of the electronic circuitry.

Many existing types of mechanical structures permit such electrical connection between the electrically-conductive material coated upon the inner surfaces of the housings of the radio communication apparatus and the electrical circuitry housed therewithin.

Historically, such structure has typically been comprised of a braid of metallic, or a conductive-rubber, material (such as an elastomeric material impregnated with a metal). When placed between the inner surface of the housing and a ground plane of an electrical circuit disposed upon an electrical circuit board, and maintaining the braid in position thereat, an electrical connection is formed between the housing and the electrical circuit. Use of such a braid or conductive-rubber material is advantageous as an electrical connection may be created between the electrically-conductive material coated upon the inner sidewalls of the housing and the electrical circuit over large areas. Additionally, such a braid or conductive-rubber material forms a seal between the two surfaces.

However, to maintain the braid in position, rib members or flanges must typically be formed on the inner surfaces of the housing, and channels must be formed in the rib members or flanges to seat the braid therein. As the braid is seated within the channel formed in the edge surface of the ribbed member or flange, the thickness of such ribbed member or flange must be at least as great as both the width of such channel and also opposing sidewalls which define the channel.

Advancements in electronic circuitry design have permitted increased miniaturization of the electronic circuitry comprising such radio communication apparatus. A radio transceiver, such as the radiotelephone utilized in a cellular, communication system, is one example of radio communication apparatus having electronic circuitry of designs which have been miniaturized.

Additional efforts to minimize further the electronic circuitry of such radio transceivers, as well as other radio communication apparatus, are ongoing.

Concomitant with such increased miniaturization of the electronic circuitry is a corresponding reduction in the physical dimensions of the housings, and other mechanical structure associated therewith, in which such electronic circuitry is housed.

Initial size reductions in the housing and associated mechanical structure was accomplished by merely reducing the scale of the dimensions of already-existing structures. However, beyond certain size reductions, such simple reduction in the scale of the dimensions of such structure increasingly becomes impractical as structural limitations of the materials compromising such structure cannot be reduced further without compromising the structural integrity thereof. For instance, the housings of such electronic devices are typically comprised of a thermoplastic material. The walls of such housings comprised of such thermoplastic material must be greater than minimal thicknesses to ensure the structural integrity of such housings. Other associated mechanical structure suffer from similar limitations. In some instances, such mechanical structure cannot be produced in commercial quantities when smaller than minimum dimensions.

As noted above, braids conventionally used to connect electrically the housing and electrical circuits disposed upon circuit boards housed therewithin are seated within channels formed in rib members or flanges of the housing. Due to the increased miniaturization of the physical dimensions of the housings of radio communication apparatus, the minimum thickness of a ribbed member or flange required to permit formation of a channel permitting seating of the braid increasingly becomes a design constraint limiting reduction in the physical dimensions of the housings of the radio communication apparatus.

Accordingly, an improved means for electrically connecting such surfaces are required to permit increased miniaturization of radio communication apparatus.

SUMMARY OF THE INVENTION

The present invention, accordingly, advantageously provides an electrically-conductive, elastomeric connector of improved design.

The present invention further advantageously provides an electrically-conductive, elastomeric connector for electrically connecting two surfaces.

The present invention provides further advantages and features, the details of which will become more evident by reading the detailed description of the preferred embodiment hereinbelow.

In accordance with the present invention, therefore, an electrically-conductive, elastomeric connector is disclosed. The elastomeric connector electrically connects an electrically-conductive portion of a first substrate with an electrically-conductive portion of a second substrate. The elastomeric connector comprises a tubular-shaped body elongated along a longitudinal axis thereof. The tubular-shaped body is capable of elastic deformation responsive to compressive forces exerted thereagainst by the first substrate when the electrically-conductive portion of the first substrate is positioned against a first side of the tubular-shaped body, thereby to connect electrically the electrically-conductive portion of the first substrate and the tubular-shaped body along the first side surface thereof. The tubular-shaped body is affixed in releasable engagement beyond a second side surface of the tubular-shaped body at an edge surface of the second substrate, such that, when positioned in the releasable engagement at the edge surface of the substrate, a surface of the elastomeric connector abuts against the electrically-conductive portion of the second substrate to connect electrically the electrically-conductive portion of the second substrate thereto.

BRIEF DESCRIPTION OF THE DRAWINGS

The present invention will be better understood when read in light of the accompanying drawings in which.

DESCRIPTION OF THE PREFERRED EMBODIMENTS

Figure 1:
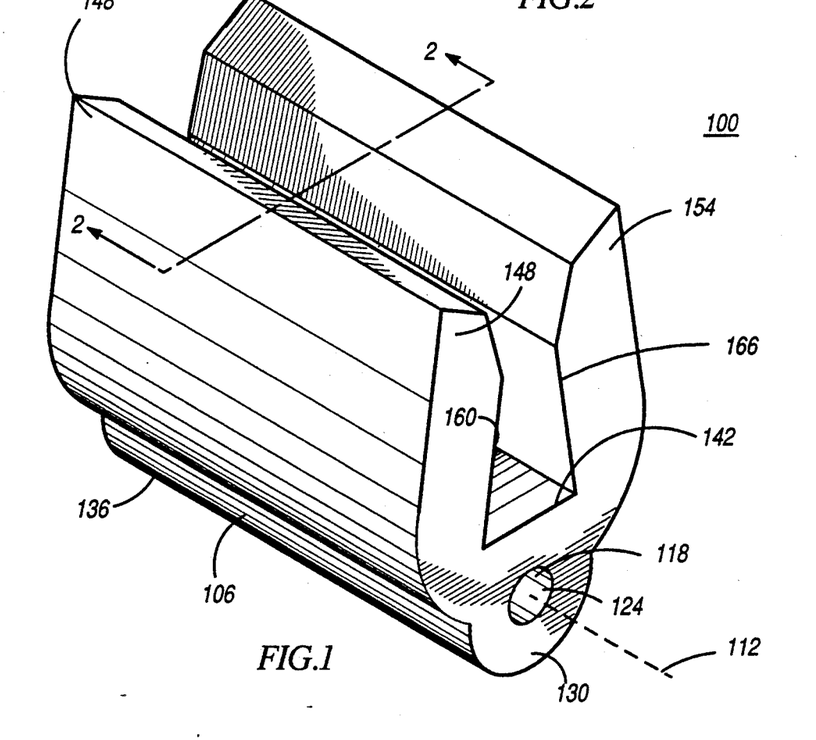
FIG. 1 is an isometric view, in isolation, of the electrically-conductive, elastomeric connector of the preferred embodiment of the present invention.

Referring first to the isometric view of FIG. 1, an elastomeric connector, referred to generally by reference numeral 100, of the preferred embodiment of the present invention is shown. Elastomeric connector 100 is comprised of an elastomeric material impregnated with a metal to be electrically conductive thereby. In the preferred embodiment, connector 100 is comprised of a silicone material impregnated with a silver-containing metal. Such a material is commercially available, and is of a relatively high conductivity. (While the conductivity of the elastomeric connector is dependent upon the cross-sectional area thereof, in the preferred embodiment, elastomeric connector 100 is of a resistance of approximately 1,400 milliohms per inch).

For purposes of illustration, connector 100 is enlarged in scale. In the preferred embodiment of the present invention, connector 100 is of a height of approximately 2.5 mil, and is of a width of approximately 1.5 mil. As connector 100 is comprised of an elastomeric material and is formed by an extrusion process, the length may be selected to be of any desired length.

Elastomeric connector 100 is comprised of a tubular-shaped body portion 106 which is elongated along a longitudinal axis, here indicated by line 112 extending longitudinally through tubular-shaped body portion 106. A longitudinally-extending aperture is formed to extend through body portion 106 of the connector. Such aperture is defined by inner sidewalls 118 which extend along body portion 106. The aperture defined thereby forms opening 124 formed upon front face surface 130 of connector 100. Preferably, the aperture defined by inner sidewalls 118 extends through the entire length of body portion 106.

Inner sidewalls 118 defining the aperture which extends through body portion 106 preferably defines an aperture of a circular, cross-section. First side surface 136 of body portion 106 forms a seating surface permitting seating of connector 100 upon a substrate (the substrate is not shown in the isolational view of FIG. 1). Formed integral with body portion 106 and extending beyond second side surface 142 of the body portion in directions generally transverse to the longitudinal axis of body portion 106 are first and second claw arms 148 and 154, respectively. Claw arms 148 and 154 are coupled at proximal ends thereof with body portion 106 and are permitted limited flexional movement thereabout due to the flexible nature of the elastomeric material of which the claw arms are comprised.

Inwardly-inclined inner surface 160 is defined upon an inner surface of first claw arm 148. Similarly, inwardly-inclined inner surface 166 is defined upon an inner surface of second second claw arm 154. Distal, end portions 172 and 178 of surfaces 160 and 166 form "lead ins" which are beveled.

Figure 2:
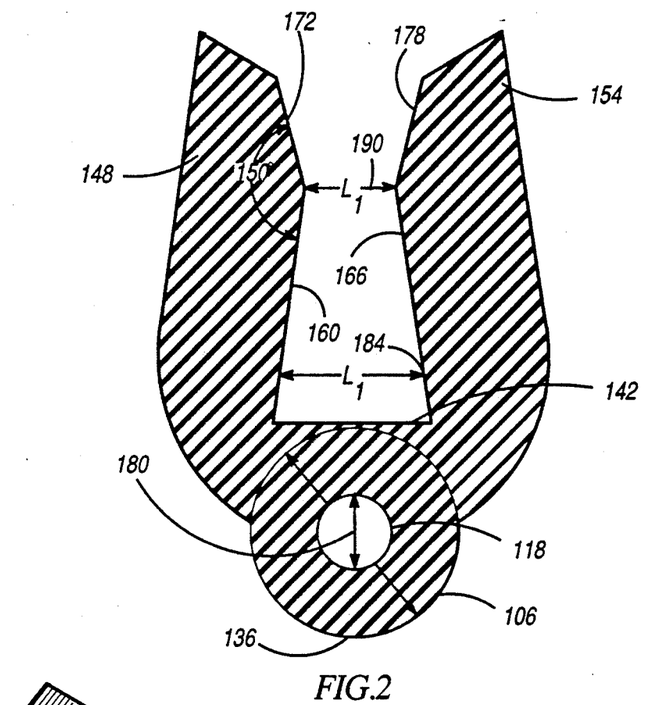
FIG. 2 is a cross-sectional view taken along line 2—2 of the elastomeric connector of FIG. 1.

Turning next to FIG. 2, a cross-sectional view of elastomeric connector 100, taken along line 2—2 of FIG. 1, is shown. Connector 100 is again shown to be formed of body portion 106 having a central aperture defined by inner sidewalls 118, and first side surface 136 formed at a first outer side surface of the body portion. Protruding beyond second side surface 142 of body portion 106 are first and second claw arms 148 and 154, respectively. Inwardly-inclined inner surfaces 160 and 166 are defined upon inner surfaces of the first and second claw arms 148 and 154, and end portions 172 and 178 of surfaces 160 and 166, respectively, form beveled lead-ins. The diameter of the aperture defined by sidewalls 118 is of a length indicated by line segment 180.

Arrow 184 extending between surfaces 160 and 166 of claw arms 148 and 154 at proximal portions of the respective claw arms close to their respective connections to second side surface 142 of body portion 106 is of a first length, here designated by length $L_1$.

Arrow 190 extending between surfaces 160 and 166 of claw arms 148 and 154, respectively, near distal ends of the respective claw arms is of a second length, here designated by length $L_2$. Because of the inwardly-inclined nature of surfaces 160 and 166, the separation distance separating surfaces 160 and 166 at proximal portions thereof (designated in the figure by length $L_1$) is greater than the separation distance separating surfaces 160 and 166 near distal ends thereof (designated in the figure by length $L_2$).

Figure 3:
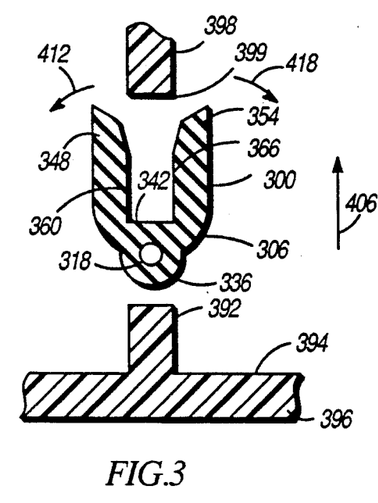
FIG. 3 is an exploded, sectional view of the elastomeric connector of the preceding Figures positioned between two surfaces which are positioned in a first arrangement.

Turning next to the exploded, sectional view of FIG. 3, the elastomeric connector of a preferred embodiment of the present invention, here designated by reference numeral 300, is shown. Similar to elastomeric connector 100 of FIGS. 1-2, connector 300 comprises a longitudinally-extending body portion 306 having a central aperture defined by inner sidewalls 318. First side surface 336 of body portion 306 forms a seating surface, and first and second claw arms 348 and 354, respectively, extend beyond second side surface 342 of body portion 306. Again, inner surfaces of claw arms 348 and 354, here designated by reference numerals 360 and 366, respectively, form inwardly-inclined surfaces.

First substrate 392, here a rib member formed to protrude beyond surface 394 of housing 396 is positioned beneath first side surface 336 of body portion 306. Second substrate 398, here an electrical circuit board, having an electrically-conductive edge surface 399, is positioned above connector 306. Preferably, and as illustrated, the thickness of second substrate 398 (i.e., the distance separating top and bottom surfaces of the substrate) is slightly less than the distance separating inner surfaces 360 and 366 of claw members 348 and 354 at proximal ends of the claw arms. (That is to say, with reference to the cross-sectional view of connector 100 of FIG. 2, separation distance $L_1$ separating inner surfaces of the claw arms near proximal portions thereof is greater than the thickness of substrate 398.) However, due to the inwardly-inclined nature of inner surfaces 360 and 366, the separation distance separating inner surfaces 360 and 366 near distal ends thereof is less than the thickness of substrate 398. (Such separation distance is indicated in the sectional view of connector 100 of FIG. 2 by length $L_2$.)

Translation of connector 300 in the direction indicated by arrow 406 to position claw arms 348 and 354 about edge surfaces of substrate 398 causes flexional movement of claw arms 348 and 354 in the directions indicated by arrows 412 and 418. Such flexional movement of claw arms 348 and 354 cause the claw arms to exert compressive forces against opposing edge surfaces of substrate 398 to affix connector 300 in position about the edge surfaces of the substrate. Translation of connector 300 is permitted such that second side surface 342 abuts against electrically-conductive edge surface 399. An electrical connection is thereby formed between connector 300 and edge surface 399 of substrate 398. Additionally, if either of edge surfaces of the opposing side surfaces of substrate 398 which abut against a corresponding one of the inner surfaces 360 and 366 of connector 300 is electrically-conductive (such as when a circuit path of an electrical circuit is formed at one of the edge surfaces of the substrate), an electrical connection is also formed between such electrically-conductive side surface or surfaces of the substrate and the connector.

Translation of substrate 392 in the direction indicated by arrow 406 (or, alternately, by translation of substrate 398 and connector 300 affixed thereto in an opposite direction) positions first side surface 336 of body portion 306 in abutting engagement against substrate 392. Such abutting engagement causes compressive forces to be exerted by substrate 392 upon side surface 336. Responsive to such compressive force exerted thereagainst, body portion 306 of connector 300 elastically deforms, and seats against substrate 392 to form an electrical connection therebetween when substrate 392, or the portion which abuts against side surface 336, is comprised of an electrically-conductive material. Because of such elastic deformation, a physical connection is created between substrate 392 and surface 336 along the entire length of connector 300.

Figure 4:
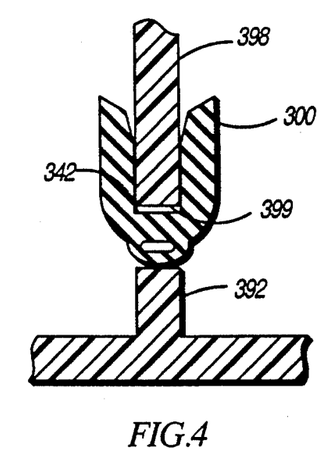
FIG. 4 is a sectional view, similar with that of FIG. 3, but illustrating the elastomeric connector positioned to connect electrically the two surfaces shown in the exploded view of FIG. 3.

The cross-sectional view of FIG. 4 illustrates the relationship between connector 300 and substrates 392 and 398 when connector 300 is positioned to connect electrically substrates 392 and 398 theretogether.

It is noted that elastic deformation of body portion 306 of connector 300 responsive to application of the compressive force against first side surface 336 of the body portion causes the configuration of the aperture defined by inner sidewalls 318 to be altered. Exertion of compressive forces against first side surface 336 of increased levels causes elastic deformation of body portion 306 until opposing, inner sidewalls formed transversely to the direction of the compressive forces exerted against first side surface 336 causes the opposing sidewalls to abut against one another. (Exertion of compressive forces against first side surface 336 of levels in excess of compressive force levels required to cause opposing inner sidewalls 318 to abut against one another can result in still further elastic deformation of tubular body portion 306; however, the levels of such compressive forces required to cause such further elastic deformation of tubular body 306 increases dramatically after opposing sidewalls forming the aperture abut against one another).

Figure 5:
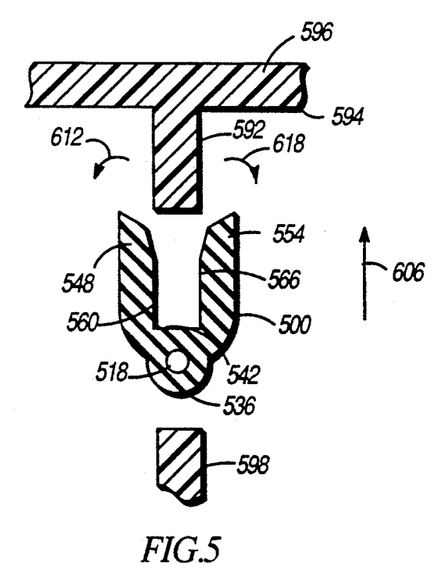
FIG. 5 is an exploded, sectional view of the elastomeric connector of the preferred embodiment, similar with that of the sectional view of FIG. 3, but positioned between two surfaces which are positioned in a second arrangement.

Turning next to the exploded, sectional view of FIG. 5, the elastomeric connector, here designated by reference numeral 500, of the preferred embodiment of the present invention, is positioned in an alternate arrangement. Similar to connectors 100 and 300 of the preceding figures, connector 500 is comprised of a tubular-shaped body portion, here designated by reference numeral 506, and inner sidewalls 518 defining a central aperture extending therethrough. First side surface 536 forms a seating surface, and, extending from second side surface 542 are first and second claw arms 548 and 554 which have inwardly-inclined inner surfaces 560 and 566.

The arrangement of FIG. 5 differs with that of FIGS. 3-4 in that substrate 592 (which corresponds to substrate 392 of FIGS. 3-4), here again a rib member formed upon an inner surface of a housing, is positioned above claw arms 548 and 554. Again, the inner surface of the housing is coated with an electrically-conductive material. And, substrate 598 (which corresponds with substrate 398 of FIGS. 3-4) is positioned beneath first side surface 536 of body portion 506.

Translation of connector 500 in the direction indicated by arrow 606 causes flexional movement of claw arms 548 and 554 in the directions indicated by arrows 612 and 618, respectively, to position the inner surfaces of the claw arms about an edge portion of substrate 592. Electrical connection is formed between connector 500 and substrate 592 as a result of abutting engagement between second side surface 542 and substrate 592 as well as physical engagement of surfaces 560 and 566 with substrate 592. Such flexional movement causes compressive forces to be exerted against the edge portion of substrate 592 by claw arms 548 and 554 to affix in position connector 500 thereagainst. Translation of the circuit board comprising substrate 598 into abutting engagement against first side surface 536 (or, alternatively, translation of substrate 592, and connector 500 affixed thereto, into abutting engagement with substrate 598) result in compressive forces being exerted against first side surface 536 to cause thereby elastic deformation of tubular body 506.

Figure 6:
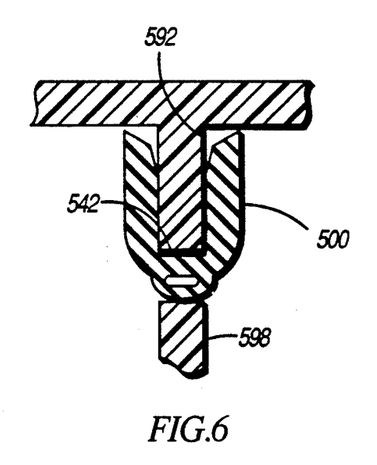
FIG. 6 is a sectional view, similar with that of FIG. 5, but illustrating the elastomeric connector positioned to connect electrically the two surfaces shown in the exploded view of FIG. 5.

FIG. 6 is a sectional view, similar with that of FIG. 5, but illustrating the relationship between connector 500 and substrates 592 and 598 to connect electrically the substrates theretogether. Again, the compressive forces exerted against connector 500 causes elastic deformation of tubular body 506 of the connector to cause opposing inner sidewalls positioned transverse to the direction of the compressive forces to approach one another. Exertion of compressive forces of increased levels causes the opposing sidewalls 518 of tubular body 506 to abut against one another.

Figure 7:
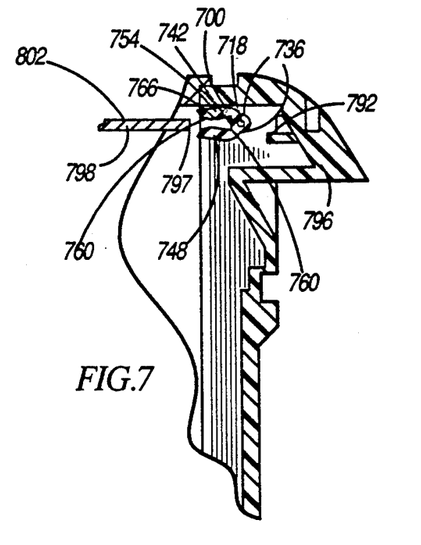
FIG. 7 is an exploded, isometric view of the elastomeric connector of the preferred embodiment of the present invention positioned between an electrical circuit board and a housing having an electrically-conductive material coated upon an inner surface thereof.

FIG. 7 is an exploded, isometric view of the elastomeric connector, here designated by reference numeral 700, of the preferred embodiment of the present invention in an arrangement analogous to the arrangement shown in the sectional view of FIG. 3. Similar to elastomeric connectors 100, 300, and 500 of the preceding figures, connector 700 is comprised of tubular-shaped body portion 706, having inner sidewalls 718 defining a central aperture extending through body portion 706, first side portion 736, second side surface 742, and first and second claw arms 748 and 754. Inner surfaces of claw arms 748 and 754 define inwardly-inclined inner surfaces 760 and 766, respectively.

Rib member 792 (upon which an electrically-conductive material is coated) formed to protrude beyond an inner surface of housing 796 is positioned beneath first side surface 736 of body portion 706 of connector 700. An electrically-conductive, edge portion 797 of circuit board 798 is positioned above claw arms 748 and 754. Edge portion 797 forms a portion of an electrical circuit disposed upon circuit board 798. Claw arms 748 and 754 may be positioned about the edge portion of circuit board 798 to affix connector 700 thereto, such that second side surface 742 abuts against edge surface 797 of circuit board 798 to connect electrically connector 700 with circuit board 798. Ribbed member 792 may be positioned in abutting engagement with first side surface 736 of body portion 706 of connector 700 to exert compressive forces thereagainst, and to connect electrically rib member 792 and electrical connector 700. Hence, ribbed member 792 may be electrically connected to circuit path 802 of an electrical circuit disposed upon circuit board 798 by way of connector 700.

Figure 8:
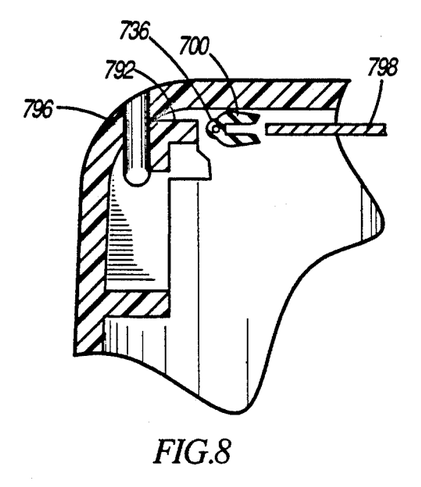
FIG. 8 is another exploded, is isometric illustration of the elastomeric connector of the preferred embodiment of the present invention positioned between an electrical circuit board and a housing having an electrically-conductive material coated upon an inner surface thereof.

FIG. 8 is another exploded, isometric view of elastomeric connector 700 of FIG. 7 positioned such that first side portion 736 thereof positioned between rib member 792 of housing 796 and circuit board 798. Translation of connector 700 positions the connector in abutting engagement with the rib member such that compressive forces are exerted by rib member 792 against side surface 736 to maintain connector 700 in electrical connection with rib member 792. Electrical circuit 798 is again illustrated above claw arms 748 and 754. (It is noted that housing 796 of FIGS. 7 and 8 differ only that a top-half of a housing is shown in the isometric view of FIG. 7, and a bottom-half of a housing is shown in the isometric view of FIG. 8.)

Figure 9:
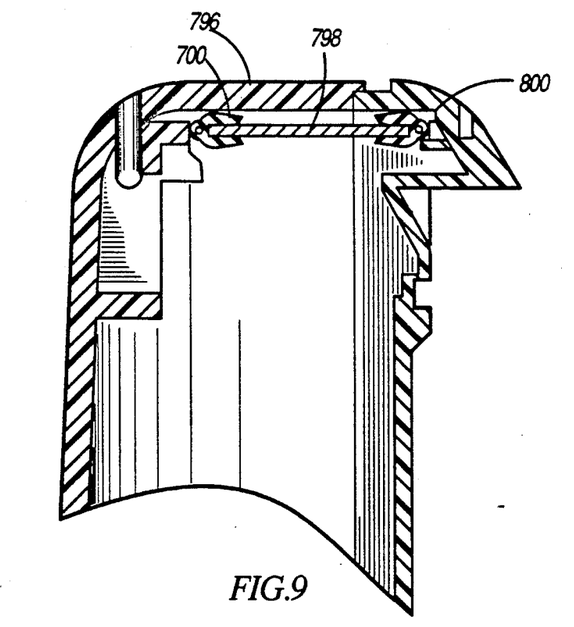
FIG. 9 is an isometric view, similar with that of FIG. 8, but illustrating the elastomeric connector of the preferred embodiment of the present invention positioned to connect electrically the housing assembly and the electrical circuit board.

Turning next to the isometric view of FIG. 9, housing 796 enclosed printed circuit board 798 having elastomeric connectors 700 and 800 affixed to opposing edge portions of circuit board 798. First side surfaces of body portions of connectors 700 and 800, respectively, seat against respective ribbed members formed to extend beyond inner surfaces of housing 796. In such manner, circuit paths disposed upon circuit boards 798 may be electrically connected to the electrically-conductive material coating the inner surfaces of housing 796.

Figures 10, 11, 12:
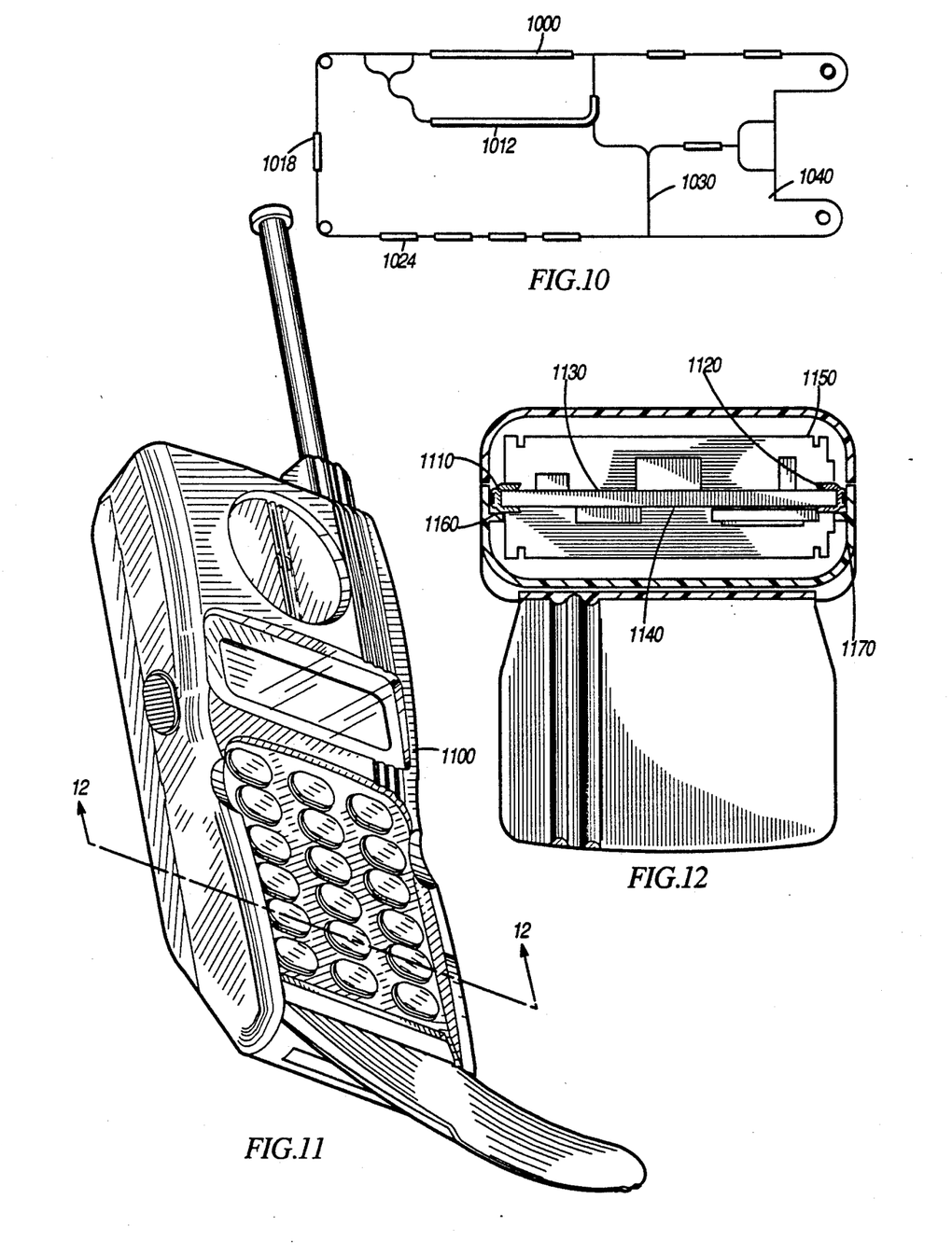
FIG. 10 is a plan view of several elastomeric connectors of the preferred embodiment of the present invention affixed to flanges formed upon an electrically-conductive substrate.
FIG. 11 is an isometric view of a radio transceiver which may employ the elastomeric connector of the preferred embodiment of the present invention.
FIG. 12 is a sectional view taken along line 12—12 of FIG. 11 illustrating a circuit board housed within the housing of the radio transceiver and which is electrically connected to an inner surface of the housing by way of elastomeric connectors of the preferred embodiment of the present invention.

Turning next to the plan view of FIG. 10, several elastomeric connectors, here designated by reference numerals 1000, 1012, 1018, and 1024 are shown in affixed engagement to flange portions 1030 formed about a peripheral portion of, and between opposing sides of, electrical shields 1040. Electrical shields may, for instance, be of dimensions suitable for positioning thereof upon an electrical circuit board having one or more electrical circuits disposed thereupon.

As mentioned previously, because the elastomeric connector of the preferred embodiment of the present invention is formed by an extrusion process, the elastomeric connector may be of any desired length. For instance, as illustrated in the Figure, connector 1000 is of a length several times greater that the lengths of connectors 1018 and 1024.

Additionally, because the elastomeric connector of the preferred embodiment of the present invention is formed of such a flexible, elastomeric material, such an elastomeric connector may be positioned to be affixed upon a non-linear flange. Connector 1012 illustrates an elastomeric connector positioned to be affixed upon such a non-linear flange.

When shield 1040, having the elastomeric connectors 1000, 1012, 1018, and 1024 affixed to flange portions 1030 thereof is lowered into abutting engagement upon an electrical circuit board, abutting engagement of side surfaces of the respective connectors 1000-1024 permits an electrical connection to be created between shield 1040 and the circuit path of the electrical circuit board.

Turning now to the isometric view of FIG. 11, a portable radio transceiver, here a cellular telephone, referred to generally by reference numeral 1100, is shown. The connector of the preferred embodiment of the present invention, and illustrated in any of the preceding figures, may be advantageously utilized as a component portion of radio transceiver 1100.

FIG. 12 illustrates a sectional view taken along lines 12—12 of FIG. 11. This sectional view illustrates the positioning of the elastomeric connectors of the preferred embodiment of the present invention, and here designated by reference numerals 1110 and 1120 positioned to electrically connect circuit paths of electrical circuit 1130 disposed upon electrical circuit board 1140 housed within housing 1150 of the radio transceiver. Rib members 1160 and 1170 formed to protrude beyond inner surfaces of housing 1150 abut against side surfaces of connectors 1110 and 1120 to permit electrical connection between the circuit paths of the electrical circuit 1130 and an electrically-conductive material coated upon the inner surfaces of housing 1150.

Because the elastomeric connector of the preferred embodiment of the present invention does not require a channel to be formed within the rib members or flange portions formed to protrude beyond the inner surfaces of housing 1150, the dimensions of such ribbed members may be further reduced, further facilitating miniaturization of the housing of such radio transceiver.

While the present invention has been described in connection with the preferred embodiment shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. An electrically-conductive, elastomeric connector for electrically connecting an electrically-conductive portion of a first substrate with an electrically-conductive portion of a second substrate, said connector comprising:

a tubular-shaped body elongated along a longitudinal axis thereof and defined by an outer circumference, said tubular-shaped body capable of elastic deformation responsive to compressive forces exerted thereagainst by the first substrate when the electrically-conductive portion of the first substrate is positioned against a seating surface formed of a circumferential portion of a first side surface of the tubular-shaped body thereby to connect electrically the electrically-conductive portion of the first substrate and the tubular-shaped body along said first side surface; and a pair of symmetrically-positioned claw arms formed integral with the tubular-shaped body, each claw arm of said pair of claw arms having a proximal end portion, a distal end portion, and an inwardly-inclined inner surface extending between the proximal end portion and the distal end portion, wherein a first claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface, and a second claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface corresponding to, but in a direction reverse of, the angular distance beyond the seating surface at which the proximal end portion of the first claw arm is positioned, the pair of claw arms for affixing the tubular-shaped body in releasable engagement at an edge surface of the second substrate, such that, when positioned in the releasable engagement at the edge surface of the second substrate, the inwardly-inclined inner surfaces of the first and second claw arms, respectively, abut against the electrically-conductive portion of the second substrate to connect electrically the electrically-conductive portion of the second substrate and the inwardly inclined inner surfaces.

2. The elastomeric connector of claim 1 wherein the seating surface and the locations at which the first and second claw arms, respectively, are affixed to the tubular-shaped body are spaced equidistantly about the outer circumference of the tubular-shaped body.

3. The elastomeric connector of claim 1 wherein said tubular-shaped body further comprises inner side walls extending along at least a portion of the tubular-shaped body wherein opposing inner sidewalls are spaced-apart by predetermined diametrical distances in the absence of exertion of compressive forces against the tubular-shaped body.

4. The elastomeric connector of claim 3 wherein elastic deformation of the tubular-shaped body responsive to exertion of compressive forces thereagainst alters the diametrical distances at which the opposing inner sidewalls are spaced-apart.

5. The elastomeric connector of claim 4 wherein elastic deformation of the tubular-shaped body during application of compressive forces thereagainst cause opposing sidewalls positioned transversely to directions of the compressive forces to abut against one another.

6. The elastomeric connector of claim 1 wherein a portion of the tubular-shaped body positioned between the locations at which the proximal end portions of the first and second claw arms, respectively, are affixed further forms a second-substrate seating surface for abutting against the electrically-conductive portion of the second substrate to form an additional electrical connection therewith.

7. The elastomeric connector of claim 1 wherein distal end portions of said first and second claw arms, respectively, are spaced-apart by distances corresponding to, but slightly less than, a distance separating top and bottom surfaces of the first substrate.

8. The elastomeric connector of claim 1 wherein locations at which the proximal end portions of the first and second claw arms are affixed to the tubular-shaped body are spaced-apart by distances at least as a great as a distance separating top and bottom surfaces of the first substrate.

9. The elastomeric connector of claim 1 wherein the inwardly-inclined inner surfaces of the first and second claw arms, respectively, are positioned in mutual opposition with one another.

10. The elastomeric connector of claim 9 wherein distances separating the inner surfaces of the first and second claw arms positioned in the mutual opposition therebetween decreases at increased extension lengths of the first and second claw arms beyond the tubular-shaped body such that the inner surfaces of the first and second claw arms near distal end portions thereof are separated by distances less than the distances separating the top and bottom surfaces of the second substrate.

11. The elastomeric connector of claim 10 wherein the distal end portions of the first and second claw arms further include beveled end surfaces.

12. An electrically-conductive, elastomeric connector for electrically connecting a circuit path of an electrical circuit disposed upon a substrate having an electrically-conductive edge portion which forms a portion of the electrical circuit with a shield which covers at least a portion of the substrate, said connector comprising:

a tubular-shaped body elongated along a longitudinal axis thereof and defined by an outer-circumference, said tubular-shaped body capable of elastic deformation responsive to compressive forces exerted thereagainst by the shield when positioned against a seating surface formed of a circumference portion of a first side surface of the tubular-shaped body, thereby to connect electrically the shield and the tubular-shaped body along said first side surface; and a pair of symmetrically-positioned claw arms formed integral with the tubular-shaped body, each claw arm of said pair of claw arms having a proximal end portion, a distal end portion, and an inwardly-inclined inner surface extending between the proximal end portion and the distal end portion, wherein a first claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface, and a second claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface corresponding to, but in a direction reverse of, the angular distance beyond the seating surface at which the proximal end portion of the first claw arm is positioned, the pair of claw arms for affixing the tubular-shaped body in releasable engagement with the electrically-conductive edge portion of the substrate, such that, when positioned in the releasable engagement at the edge surface of the substrate, the inwardly-inclined inner surfaces of the first and second claw arms respectively, abut against the electrically-conductive edge portion of the substrate to connect electrically the circuit path and the inwardly-inclined surfaces.

13. The elastomeric connector of claim 12 wherein said tubular-shaped body further comprises inner sidewalls extending along at least a portion of the tubular-shaped body wherein opposing inner sidewalls are spaced-apart by predetermined diametrical distances in the absences of exertion of compressive forces against the tubular-shaped body.

14. The elastomeric connector of claim 13 wherein elastic deformation of the tubular-shaped body responsive to exertion of compressive forces thereagainst alters the diametrical distances at which the opposing inner sidewalls are spaced-apart.

15. The elastomeric connector of claim 12 wherein the locations at which the proximal end portions of the first and second claw arms are affixed to the tubular-shaped body are spaced-apart by distances at least as great a distance separating top and bottom surfaces of the substrate.

16. An electrically-conductive, elastomeric connector for electrically connecting a circuit path of an electrical circuit disposed upon a substrate with an electrically-conductive rib member, said connector comprising:

tubular-shaped body elongated along a longitudinal axis thereof and defined by an outer circumference, said tubular-shaped body capable of elastic deformation responsive to compressive forces exerted thereagainst by the substrate when the substrate is positioned against a seating surface formed of a circumferential portion of a first side surface of the tubular-shaped body such that the circuit path of the electrical circuit disposed upon the substrate abuts against the tubular-shaped body, thereby to connect electrically the circuit and the tubular-shaped body along the seating surface thereof; and a pair of symmetrically-positioned claw arms formed integral with the tubular-shaped body, each claw arm of said pair of claw arms having a proximal end portion, a distal end portion, and an inwardly-inclined inner surface extending between the proximal end portion and the distal end portion, wherein a first claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface, and a second claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface corresponding to, but in a direction reverse of, the angular distance beyond the seating surface at which the proximal end portion of the first claw arm is positioned, the pair of claw arms for affixing the tubular-shaped body in releasable engagement at an edge surface of the electrically-conductive rib member, thereby to connect electrically the electrically-conductive rib member and the inwardly-inclined inner surfaces of the first and second claw arms when said first and second claw arms are positioned in the releasable engagement at the edge surface of the electrically-conductive rib member.

17. In a radio transceiver having at least one circuit board housed within a housing, the least one circuit board having an electrical circuit, including a circuit path, disposed thereupon, and the housing having at least a portion of an inner surface thereof comprised of an electrically-conductive material, the combination with the at least one electrical circuit board of an elastomeric connector, said elastomeric connector comprising:

a tubular-shaped body elongated along a longitudinal axis thereof and defined by an outer circumference, said tubular-shaped body capable of elastic deformation responsive to compressive forces exerted thereagainst by the housing when the portion of the inner surface of the housing is positioned against a seating surface formed of a circumferential portion of a first side surface of the tubular-shaped body, thereby to connect electrically the housing and the tubular-shaped body along said seating surface; and a pair of symmetrically-positioned claw arms formed integral with the tubular-shaped body, each claw arm of said pair of claw arms having a proximal end portion, a distal end portion, and an inwardly-inclined inner surface extending between the proximal end portion and the distal end portion, wherein a first claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface, and a second claw arm of the pair of claw arms is affixed to the tubular-shaped body to extend therebeyond in a direction generally transverse to the longitudinal axis of the tubular-shaped body at a location upon the circumference of the tubular-shaped body spaced an angular distance beyond the seating surface corresponding, to but in a direction reverse of, the angular distance beyond the seating surface at which the proximal end portion of the first claw arm is positioned, the pair of claw arms for affixing the tubular-shaped body in releasable engagement at an edge surface of the circuit board, such that, when positioned in the releasable engagement at the edge surface of the circuit board, a surface of said inwardly-inclined inner surfaces of the first and second claw arms abut against the circuit path of the electrical circuit disposed upon the circuit board to connect electrically the circuit path and the first and second claw arms.

* * * * *